US006519344B1

(12) United States Patent
Yajima et al.

(10) Patent No.: US 6,519,344 B1
(45) Date of Patent: Feb. 11, 2003

(54) AUDIO SYSTEM

(75) Inventors: Kiyoshi Yajima; Satoshi Kumada, both of Saitama-ken (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/407,983

(22) Filed: Sep. 29, 1999

(30) Foreign Application Priority Data

Sep. 30, 1998 (JP) .......................................... 10-278341

(51) Int. Cl.$^7$ ............................ H03G 5/00; H04R 5/00

(52) U.S. Cl. ............................ 381/103; 381/27; 381/1

(58) Field of Search ............................ 381/1, 27, 103, 381/98, 96; 333/28 R

(56) References Cited

U.S. PATENT DOCUMENTS 5,333,200 A * 7/1994 Cooper et al. ................. 381/1
5,384,856 A * 1/1995 Kyouno et al. ............. 381/103
5,526,378 A * 6/1996 Knustson et al. .......... 333/28 R
5,724,485 A * 3/1998 Rainton ....................... 381/71
5,815,580 A * 9/1998 Craven et al. .............. 381/103

* cited by examiner

*Primary Examiner*—Forester W. Isen
*Assistant Examiner*—Laura A. Grier
(74) *Attorney, Agent, or Firm*—Arent Fox Kintner Plotkin & Kahn

(57) ABSTRACT

There is provided an audio system which suppresses standing waves. An audio signal source (1) outputs audio signals ($S_R$) and ($S_L$) which are then supplied to reproducing loudspeakers (3) and (4),installed in a room (2), where the reproduced sounds are outputted. Furthermore, the audio signals ($S_R$) and ($S_L$) are added at an adder (9) to obtain signal (S2) which is in turn filtered by a compensating filter and then inverted by means of an inverting circuit (13). This generates a compensation signal (Sc) with a phase opposite to that of the standing wave. The compensation signal (Sc) is supplied to a compensating loudspeaker (5) installed in the room (2), whereby sound for canceling out the standing wave is outputted. The compensating filter has its frequency characteristics set in accordance with the cross-correlation function between a transfer function from the reproducing loudspeakers, (3) and (4), to a listening location and a transfer function from the compensating loudspeaker (5) to the listening location.

6 Claims, 9 Drawing Sheets

AUDIO SYSTEM

BACKGROUND OF THE INVENTION

The present invention relates to an audio system, and more particularly to an audio system which suppresses standing waves produced in a room to provide an improved sound effect as perceived.

A conventionally known audio device of this type is disclosed in Japanese Patent Laid-Open Publication No. Hei 9(1997)-22293.

This audio device allows audio signals to pass through adaptive filters to supply the signals to reproducing loudspeakers. Then, sound outputted from the reproducing loudspeakers is measured by means of a microphone arranged at a listening location. Frequency characteristics of the adaptive filters are appropriately adjusted so that the difference between the measured signal thus obtained and said audio signal becomes zero, whereby standing waves uncomfortable as perceived are prevented from being produced.

Standing waves uncomfortable to a listener are characterized by the resonance frequency of a transfer function of the room. Accordingly, the audio signal is filtered in advance by an adaptive filter which is able to cancel out the effects of the transfer function and the audio signal thus filtered is supplied to the reproducing loudspeaker, whereby uncomfortable standing waves are prevented from being produced in the room.

However, in the aforementioned conventional audio device, the audio signal is not supplied directly to the reproducing loudspeaker, but is filtered by means of the aforementioned adaptive filter and then supplied to the reproducing loudspeaker.

Accordingly, in some cases, the filtering process produced wave distortion in the audio signal, or such frequency components exceeding the reproduction capability of the reproducing loudspeaker were mixed in the audio signal. Consequently, there was a problem that the reproducing loudspeaker produced distorted sound or unnatural sound as perceived.

SUMMARY OF THE INVENTION

The present invention has been developed in view of the aforementioned problem and an object of the present invention is to provide an audio system which enables creating of a natural sound field space as perceived and suppressing of standing waves.

A first aspect of the present invention is to provide an audio system comprising a signal source for outputting audio signals, a first sound source for receiving the audio signals supplied by the signal source to reproduce and output sound, compensation means for generating compensation signals for suppressing standing waves by signal-processing the audio signals, and a second sound source for receiving the compensation signals supplied by the compensation means to reproduce and output sound for suppressing standing waves, wherein the compensation means comprises correlator means for determining a cross-correlation function between a transfer function from the first sound source to a listening location and a transfer function from the second sound source to the listening location, filter means having frequency characteristics based on the cross-correlation function generated by the correlator means, and signal inverting means, the filter means filters the audio signals and the signal inverting means inverts signals generated through the filtering, whereby compensation signals to be supplied to the second sound source are generated.

According to the above-mentioned constructions, the standing wave resulted from the transfer function from the first sound source to the listening location is canceled out by the sound which the second sound source outputs upon receiving the compensation signal. Consequently, sound outputted by the first sound source, that is, the sound reproduced based on the intrinsic audio signal reaches the listening location. Accordingly, a sound field space which is not affected by the standing wave uncomfortable as perceived is created at the listening location.

Furthermore, the cross-correlation function represents the similarity between the transfer function from the first sound source to the listening location and the transfer function from the second sound source to the listening location. Therefore, setting the filter means to the frequency characteristics which are characterized by this cross-correlation function causes the filter means to generate a signal having frequency characteristics close to those of the standing wave. Furthermore, inverting the signal by the signal inverting means generates a signal which causes the second sound source to generate sound having an opposite phase with respect to the standing wave, that is, a compensation signal.

A second aspect of the present invention is to provide an audio system comprising a signal source for outputting audio signals, a first sound source for receiving the audio signals supplied by the signal source to reproduce and output sound, compensation means for generating compensation signals for suppressing standing waves by signal-processing the audio signals, and a second sound source for receiving the compensation signals supplied by the compensation means to reproduce and output sound for suppressing standing waves, the audio system further comprising convolution operational means for performing a convolution operation of a transfer function from the second sound source to the listening location and a transfer function of a predetermined filter means, correlator means for determining a cross-correlation function between an operational result of the convolution operational method, and a transfer function from the first sound source to the listening location, extracting means for extracting feature information regarding phases and gain characteristics of the cross-correlation function for the transfer function of the predetermined filter means, filter means to be set to frequency characteristics characterized by the feature information extracted by the extracting means, and signal inverting means, wherein the filter means is used for filtering the audio signals and the signal inverting means inverts signals generated through the filtering, whereby compensation signals to be supplied to the second sound source are generated.

The cross-correlation function obtained through the operation of the convolution operational means and the correlator means represents the similarity between the first transfer function from the first sound source to the listening location and the second transfer function from the second sound source to the listening location. Therefore, setting the filter means to the frequency characteristics which are characterized by this cross-correlation function causes the filter means to generate a signal having frequency characteristics close to those of the standing wave. Furthermore, inverting the signal by the signal inverting means generates a signal which causes the second sound source to generate sound having an opposite phase with respect to the standing wave, that is, a compensation signal.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 1:
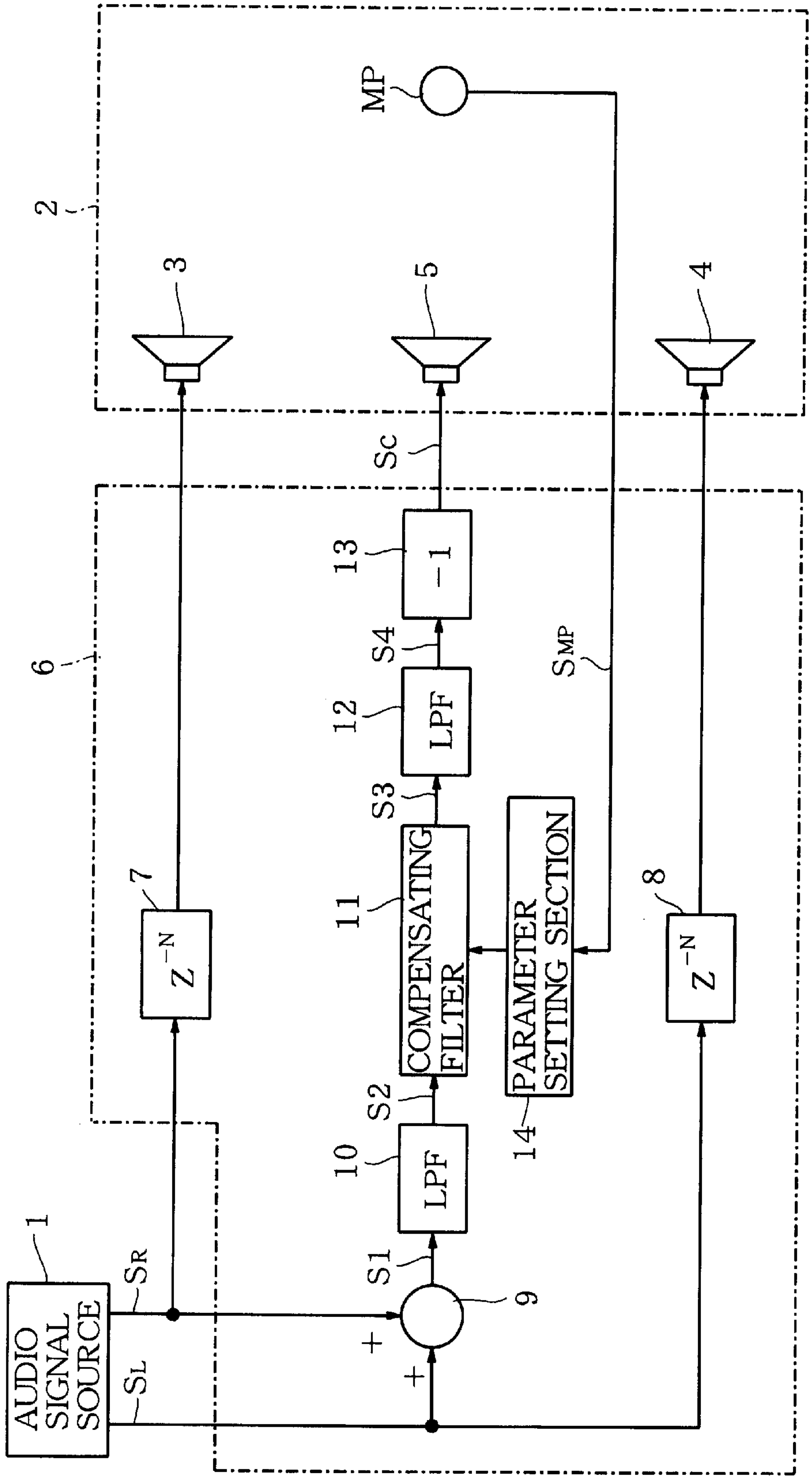
FIG. 1 is a block diagram showing the overall configuration of an audio system according to the present invention.

An embodiment of a stereophonic audio system to which the present invention is applied will be explained below with reference to the drawings. FIG. 1 is a block diagram showing the configuration of an audio system of this embodiment. In FIG. 1, the audio system comprises an audio signal source 1 such as a radio receiver or a CD player, ordinary reproducing loudspeakers 3 and 4 disposed in a room 2, a compensating loudspeaker 5 and a compensation circuit 6.

The compensation circuit 6 comprises a digital signal processing circuit such as DSP (Digital Signal Processor) which performs digital signal processing in synchronization with sampling period Ts, the sampling period Ts being represented by an inverse of a predetermined sampling frequency fs (in this embodiment, fs=48,000 Hz).

In addition, there are provided delay circuits 7 and 8 which delay stereophonic audio signals, $S_R$ and $S_L$, by predetermined delay time τd to supply the signals to the reproducing loudspeaker 3 and 4, respectively, the stereophonic audio signals $S_R$ and $S_L$ being outputted from the audio signal source 1 by means of the digital signal processing circuit. Moreover, there are provided transfer elements such as an adder 9, a low-pass filter 10, a compensating filter 11, a low-pass filter 12, an inverting circuit 13, and a parameter setting section 14. These transfer elements generate compensation signal Sc based on the audio signals $S_R$ and $S_L$ for suppressing standing waves and supply the signal Sc to the compensating loudspeaker 5.

Although not shown in the figure, the audio signals $S_R$ and $S_L$, digitized into a predetermined number of digits, are supplied from the audio signal source 1 to the compensation circuit 6. Moreover, signals outputted from the delay circuits 7 and 8, and the inverting circuit 13 are converted into analog signals by a D/A converter or the like to be supplied through an analog power amplifier to the reproducing loudspeakers 3 and 4, and the compensating loudspeaker 5, respectively.

The delay circuits 7 and 8 are provided with the delay time τd which is equal to a delay time in the path from the adder 9 to the inverting circuit 13. The delay time τd is obtained by connecting in series N unit delay elements with a unit delay time of $z^{-1}$ which is equal to the sampling period Ts. Accordingly, the signal propagation delay time from the audio signal source 1 to the reproducing loudspeaker 3, the signal propagation delay time from the audio signal source 1 to the reproducing loudspeaker 4, and the signal propagation delay time from the audio signal source 1 to the compensating loudspeaker 5 are made equal to one another.

The adder 9 adds the audio signals $S_R$ and $S_L$ to generate and supply the added audio signal S1 to the low-pass filter 10.

The low-pass filter 10 is composed of an acyclic filter such as an FIR (Finite Impulse Response) digital filter, and limits the bandwidth of the added audio signal S1 within a predetermined audio frequency bandwidth (approximately 0 to 2,000 Hz) to produce an added audio signal S2 for output.

The compensating filter 11 is composed of an acyclic filter such as an FIR digital filter, and generates a compensation signal S3 for suppressing the occurrence of standing waves by performing the predetermined filtering of the added audio signal S2 whose bandwidth is limited by the low-pass filter 10.

The low-pass filter 12 is composed of an acyclic filter such as an FIR digital filter, and limits the bandwidth of a compensation signal S3 within a predetermined audio frequency bandwidth (approximately 0 to 2,000 Hz) for output. That is, the low-pass filter 12 is provided in order to eliminate the effects of high-frequency noise components or aliasing errors, which are mixed into the compensation signal S3 when the compensating filter 11 performs filtering.

The inverting circuit 13 comprises a digital inverter or the like, and inverts compensation signal S4, whose bandwidth is limited by the low-pass filter 12, into compensation signal Sc which is in turn supplied to the compensating loudspeaker 5.

The parameter setting section 14 measures sound at a listening location by means of a microphone MP installed at the listening location in the room 2 through the preprocessing which is to be described later, and sets frequency characteristics of the parameter setting section 11 based on the measured signal $S_{MP}$.

Figure 2:
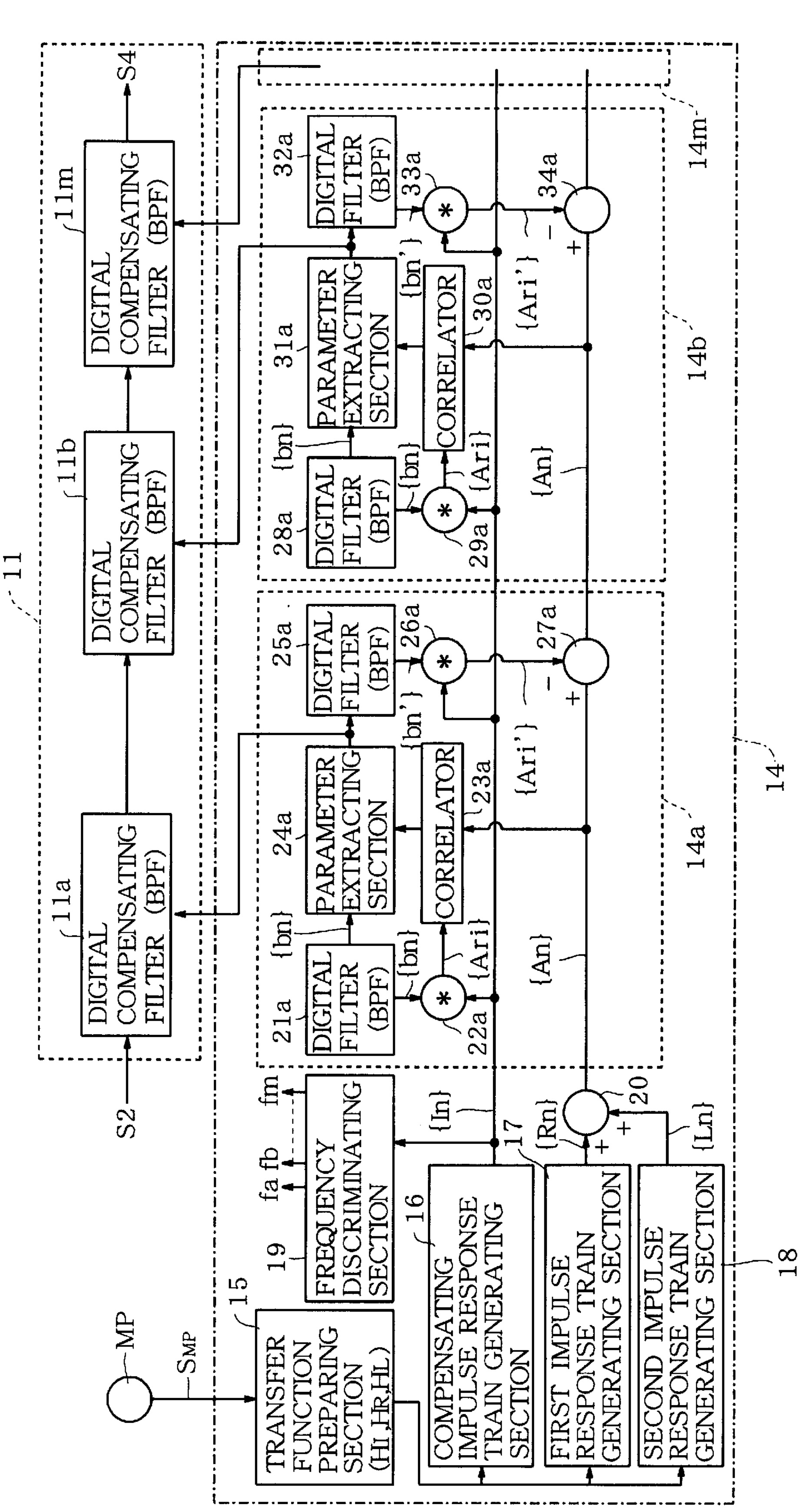
FIG. 2 is a block diagram showing the configuration of a compensating filter and parameter setting section of the audio system according to the present invention.

FIG. 2 is a block diagram showing in detail the configuration of the compensating filter 11 and the parameter setting section 14. In the figure, the compensating filter 11 is composed of a plurality of digital compensating filters 11*a* to 11*m*, as band-pass filters, connected in series. Moreover, each of these digital compensating filters 11*a* to 11*m* comprises an acyclic filter such as an FIR digital filter.

The parameter setting section 14 comprises parameter preparing sections 14*a* to 14*m* provided corresponding to the digital compensating filters 11*a* to 11*m*, a transfer function preparing section 15 for preparing predetermined transfer functions $H_I$, $H_R$. and $H_L$ based on the measured signal $S_{MP}$ from the microphone MP, a compensating impulse response train generating section 16 for generating an impulse response train {In} of a discrete time system of the transfer function $H_I$, a first impulse response train generating section 17 for generating an impulse response train {Rn} of a discrete time system of the transfer function $H_R$, a second impulse response train generating section 18 for generating an impulse response train {Ln} of a discrete time system of the transfer function $H_L$, a frequency discriminating section 19 for determining peak frequencies fa to fm of the frequency characteristics of the transfer function $H_I$ based on the impulse response train {In}, and an adder 20 for adding the impulse response trains {Rn} and {Ln} into an impulse response train {An} for output.

In the foregoing, the transfer function preparing section 15 determines the transfer function (hereinafter designated the first transfer function) $H_R$ of the room 2 from the reproducing loudspeaker 3 to the listening location by applying the discrete Fourier transform (DFT) or the like to analyze the frequency characteristics of the measured signal $S_{MP}$ obtained when sound is delivered only from the reproducing loudspeaker 3. Moreover, the transfer function preparing section 15 determines the transfer function (hereinafter designated the second transfer function) $H_L$ of the room 2 from the reproducing loudspeaker 4 to the listening location by applying the DFT or the like to analyze the frequency characteristics of the measured signal $S_{MP}$ obtained when sound is delivered only from the reproducing loudspeaker 4. Moreover, the transfer function preparing section 15 determines the transfer function $H_I$ of the room 2 from the compensating loudspeaker 5 to the listening location by applying the DFT or the like to analyze the frequency characteristics of the measured signal $S_{MP}$ obtained when sound is delivered only from the compensating loudspeaker 5.

The compensating impulse response train generating section 16 generates the impulse response train {In} by applying the inverse discrete Fourier transform (IDFT) to the transfer function $H_I$. Moreover, the first impulse response train generating section 17 generates the impulse response train {Rn} by applying the inverse discrete Fourier transform to the first transfer function $H_R$. Additionally, the second impulse response train generating section 18 generates the impulse response train {Ln} by applying the inverse discrete Fourier transform to the second transfer function $H_L$.

The frequency discriminating section 19 detects peaks of the impulse response train {In} to calculate m resonance frequencies, fa to fm, from the positions of occurrence of the m highest peaks. That is, since each position of occurrence of the peaks has a value proportional to the sampling frequency Ts, resonance frequencies, fa to fm, are determined by taking an inverse of each position of occurrence of the peaks.

The parameter preparing sections 14*a* to 14*m* are constituted in a similar fashion, respectively. To describe representatively, the parameter preparing section 14*a* is provided with bandpass filters 21*a* and 25*a* comprising acyclic filters such as FIR digital filters (hereinafter called digital filters 21*a* and 25*a*), convolution operational sections 22*a* and 26*a*, a correlator 23*a*, a parameter extracting section 24*a*, and an adder-subtractor circuit 27*a*.

The digital filter 21*a*, though preset to a predetermined pass bandwidth, comprises an acyclic filter whose center frequency is adjustable, and is designed to set the center frequency based on the resonance frequency fa determined at the frequency discriminating section 19.

The convolution operational section 22*a* generates a numeric train {Ari} through the convolution operation of the impulse response train {bn} and the impulse response train {In} of the digital filter 21*a*. That is, this convolution operation generates the numeric train {Ari} which is equivalent to that obtained by filtering the transfer function $H_I$ by means of the digital filter 21*a*.

The correlator 23*a* operates the cross-correlation function Rab between the numeric train {Ari} and the impulse response train {An}, and operates the autocorrelation function Rib of the numeric train {Ari} as well. Moreover, by dividing the cross-correlation function Rab by the autocorrelation function Rib, the correlator 23*a* calculates the cross-correlation function Rab/Rib which represents the gain ratio of the cross-correlation function Rab to the autocorrelation f unction Rib.

The parameter extracting section 24*a* determines the maximum correlation value Rmax and a phase difference of $\Delta\tau 1$ between the position (phase) where the maximum value bmax exists in the impulse response train {bn} and the position (phase) where the maximum correlation value Rmax of the cross-correlation function Rab/Rib exists.

Then, the phase of the impulse response train {bn} of the digital filter 21*a* is advanced by the phase difference of $\Delta\tau 1$. In addition, the digital filter 25*a* is set to a band-pass filter equivalent to impulse response train {bn}' obtained by multiplying the phase-advanced impulse response train by the maximum correlation value Rmax.

Furthermore, the parameter extracting section 24*a* adjusts the digital compensating filter 11*a* to the impulse response train {bn}' which is the same as the digital filter 25*a*. As mentioned in the foregoing, making the digital compensating filter 11*a* the same as the impulse response train {bn}' causes the digital compensating filter 11*a* to become a band-pass filter having almost the same frequency characteristics as those of standing waves produced in the room 2.

The convolution operational section 26*a* convolution-operates the impulse response train {bn}' of the digital filter 25*a* and the impulse response train {In} to supply the resultant numeric train {Ari'} to the adder-subtractor circuit 27*a*.

The adder-subtractor circuit 27*a* subtracts the numeric train {Ari'} from the impulse response train {An} to supply the resultant impulse response train {An-Ari'} to the parameter preparing section 14*b*, the next stage.

Then, the remaining parameter preparing sections 14*b* to 14*m* have the same configuration as that of the parameter preparing section 14*a*, and set impulse response trains of the digital compensating filters 11*b* to 11*m* corresponding to the parameter preparing sections 14*b* to 14*m*, respectively. Incidentally, each of components 28*a* to 34*a* of the parameter preparing section 14*b* corresponds to each of components 21*a* to 27*a* of the parameter preparing section 14*a*.

The operation of the audio system of the present invention having the configuration mentioned above is to be explained below.

Before the audio system is used under normal conditions, preprocessing is carried out to initialize the impulse response train of the compensating filter 11.

First, the audio signal source 1 outputs the pulse-shaped audio signal $S_R$ and then the microphone MP measures only the sound outputted from the reproducing loudspeaker 3. Then, based on the resultant measured signal $S_{MP}$, the transfer function preparing section 15 operates the transfer function $H_R$ of the room 2 between the reproducing loudspeaker 3 and the listening location. Moreover, the first impulse response train generating section 17 generates the impulse response train {Rn} which is equivalent to the transfer function $H_R$.

Furthermore, the audio signal source 1 outputs the pulse-shaped audio signal $S_L$ and then the microphone MP measures only the sound outputted from the reproducing loudspeaker 4. Then, based on the resultant measured signal $S_{MP}$, the transfer function preparing section 15 operates the transfer function $H_L$ of the room 2 between the reproducing loudspeaker 4 and the listening location. Moreover, the second impulse response train generating section 18 generates the impulse response train {Ln} which is equivalent to the transfer function $H_L$.

Furthermore, the audio signal source 1 outputs the pulse-shaped audio signals $S_L$ and $S_R$, and then the microphone MP measures only the sound outputted from the compensating loudspeaker 5. Then, based on the resultant measured signal $S_{MP}$, the transfer function preparing section 15 calculates the transfer function $H_I$ of the room 2 between the compensating loudspeaker 5 and the listening location. Moreover, the compensating impulse response train generating section 16 generates the impulse response train {In} which is equivalent to the transfer function $H_I$.

Subsequently, the frequency discriminating section 19 discriminates the resonance frequencies fa, and fb to fm from the impulse response train {In} to determine the resonance frequencies to be center frequencies of the digital filters 21*a*, 28*a*, etc., in each of the parameter preparing sections 14*a*, and 14*b* to 14*m*.

Now, the impulse response train {In} and the impulse response train {An} which is generated by adding the impulse response trains {Rn} and {Ln} are supplied to the parameter preparing section 14*a*, and the parameter preparing sections 14*a* to 14*m* perform the aforementioned processing based on the impulse response trains {In} and {An}, whereby impulse response trains of the digital compensating filters 11*a* to 11*m* constituting the compensating filter 11 are determined.

As mentioned above, when all impulse response trains of the digital compensating filters 11*a* to 11*m* have been determined, the preprocessing is completed to be available for the operation similar to that of an ordinary audio system.

Subsequently, when a user operates the audio system to output ordinary audio signals $S_R$ and $S_L$ such as stereophonic music from the audio signal source 1, the right audio signal $S_R$ is supplied to the reproducing loudspeaker 3 through the delay circuit 7, while the left audio signal $S_L$ is supplied to the reproducing loudspeaker 4 through the delay circuit 8. This allows each of the reproducing loudspeakers 3 and 4 to output stereophonic music on the right and left.

Simultaneously, the adder 9 adds the audio signals $S_R$ and $S_L$ to generate the added audio signal S1. Then, the added audio signal S1 passes through the low-pass filter 10, the compensating filter 11, and the low-pass filter 12, thereby generating the compensation signal S4 equivalent to standing waves produced in the room 2. Moreover, the compensation signal S4 passes through the inverting circuit 13, whereby the compensation signal Sc having the phase opposite to that of the standing waves produced in the room 2 is generated and supplied to the compensating loudspeaker 5. Therefore, a sound having the phase opposite to that of the standing wave produced in the room 2 caused by the sound outputted from the reproducing loudspeakers 3 and 4 is outputted from the compensating loudspeaker 5.

Then, the sound outputted from the compensating loudspeaker 5 cancels out the standing waves produced in the room 2 which are caused by the sound outputted from the reproducing loudspeakers 3 and 4. Consequently, at the listening location, a sound field space is created which is similar to a natural sound field space where only the sound from the reproducing loudspeakers 3 and 4 by the audio signals $S_R$ and $S_L$ is outputted. Thus, an improved sound field space for the listener to perceive can be provided.

Furthermore, the audio system supplies the audio signals $S_R$ and $S_L$ of the music or the like, which the listener wants to listen to, directly to the reproducing loudspeakers 3 and 4, while supplying the compensation signal Sc for suppressing standing waves to the compensating loudspeaker 5, thereby enabling providing natural sound to the listener. In addition, the loudspeakers 3, 4, and 5 are never over-loaded exceeding each of the operational characteristics, thereby enabling preventing of the occurrence of sound distortion or the like.

Incidentally, although the compensating filter 11 comprising a plurality of digital compensating filters 11*a* to 11*m* has been explained, the compensating filter 11 may be comprised only of the first-stage digital compensating filter 11*a* since the first-stage digital compensating filter 11*a* contributes most effectively to suppressing standing waves. However, using two or more of the digital compensating filters 11*a* to 11*m* allows the impulse response train of the compensating filter 11 to approach closer the frequency characteristics of standing waves compared with using the compensating filter 11 comprising only one digital compensating filter 11*a*. Therefore, it is preferable to adjust the number of compensating digital filters to service conditions, etc.

Now, the evaluation results are to be explained with reference to the characteristic diagrams shown in FIGS. 3 to 9(*b*). Here, the case where the compensating filter 11 comprises the two digital compensating filters 11*a* and 11*b* is to be explained.

Evaluation was made by setting the audio frequency bandwidth to 0 to 2000 Hz and the sampling frequency to 48000 Hz, and by disposing the reproducing loudspeakers 3 and 4 and the compensating loudspeaker 5 as shown in FIG. 1 in the room 2 of a given shape and volume.

Figure 3:
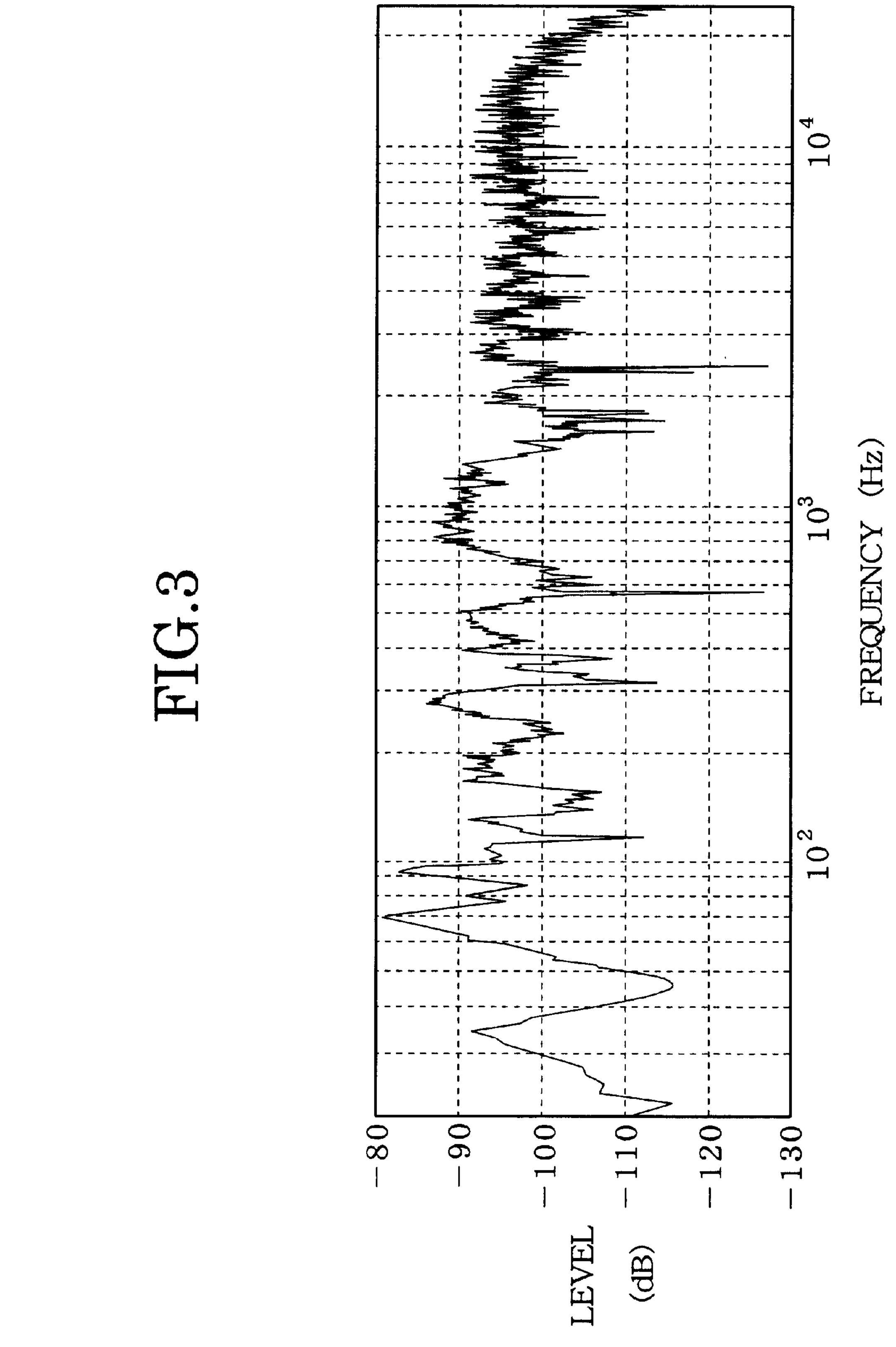
FIG. 3 is a characteristic graph showing the frequency characteristics of sound with standing waves produced.

In addition, without the sound from the compensating loudspeaker 5 being delivered, the stereophonic sound produced by supplying the audio signals $S_R$ and $S_L$ with given frequency characteristics to the reproducing loudspeakers 3 and 4 was measured by means of the microphone MP installed at the listening location, and thus the frequency characteristics of the measured signal $S_{MP}$ was provided as shown in FIG. 3.

Evaluation was made on the standing wave suppression effect which can be obtained by generating the compensation signal Sc based on the audio signals $S_R$ and $S_L$ which derive the sound of the aforementioned frequency characteristics, and by simultaneously supplying the compensation signal Sc and the audio signals $S_R$ and $S_L$ to the compensating loudspeaker 5 and the reproducing loudspeakers 3 and 4.

Figure 4A:
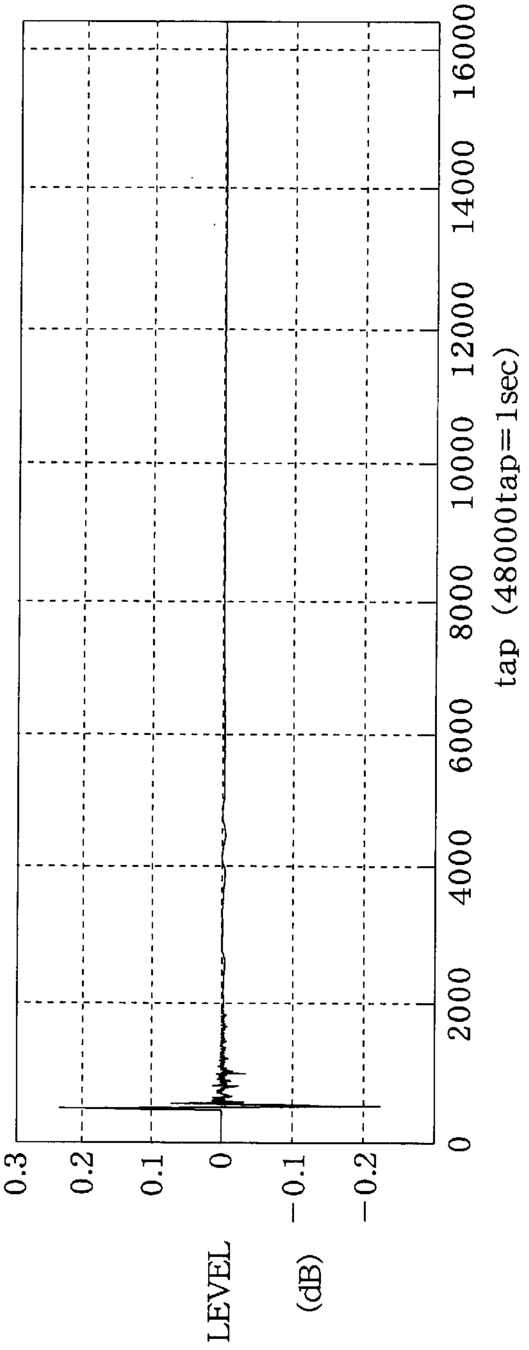
FIGS. 4(*a*) and 4(*b*) are waveform views showing impulse response trains {In} and {An}, respectively.
Figure 4B:
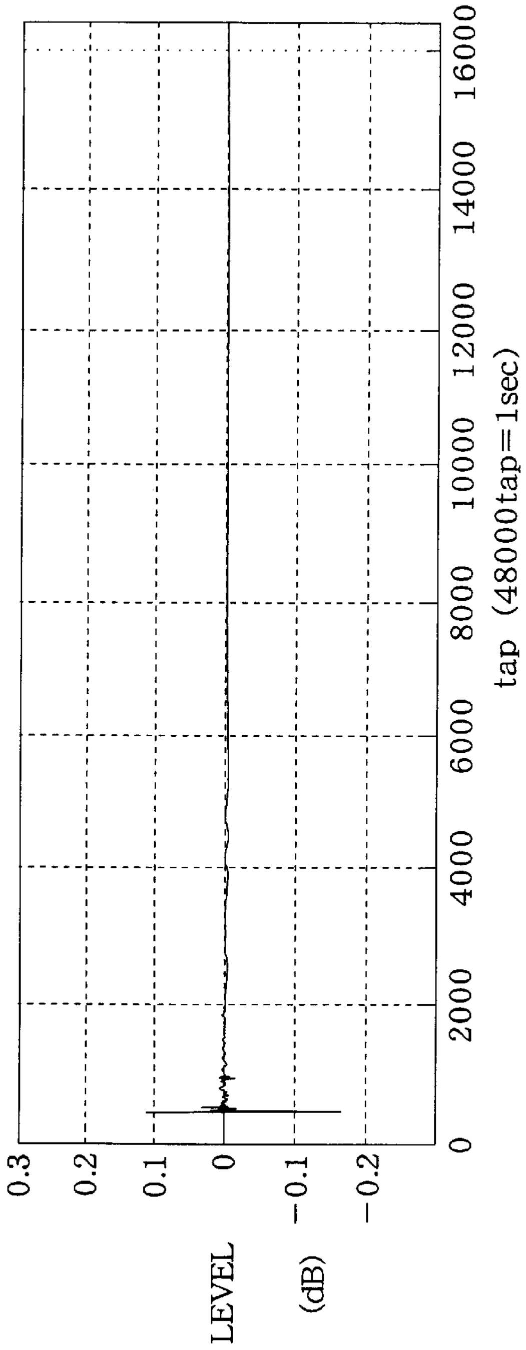

FIGS. 4(*a*) and 4(*b*) show the impulse response trains {In} and {An}, which were generated under such evaluation conditions. Additionally, the frequency discriminating section 19 detected resonance frequency fa of approximately 69 Hz and resonance frequency fb of approximately 94 Hz.

Figure 5A:
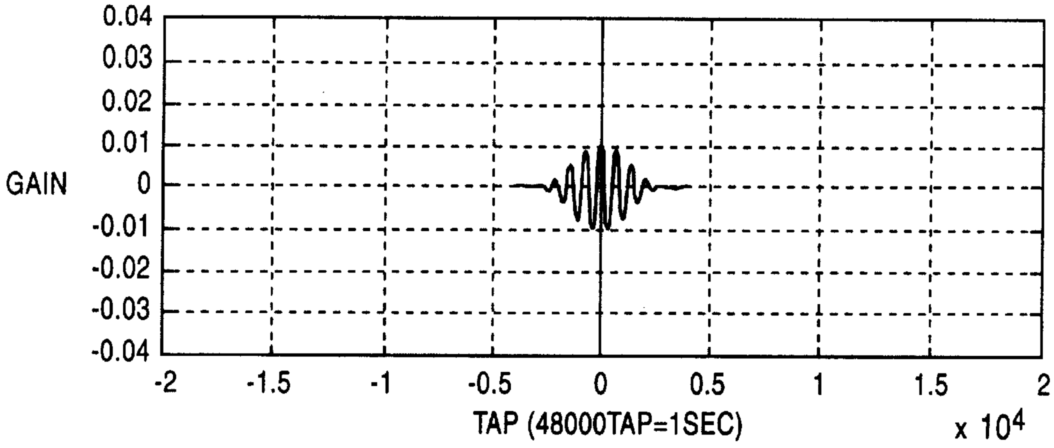
FIGS. 5(*a*), 5(*b*) and 5(*c*) are explanatory views showing the impulse response trains of digital compensating filters and their formation processes.
Figure 5B:
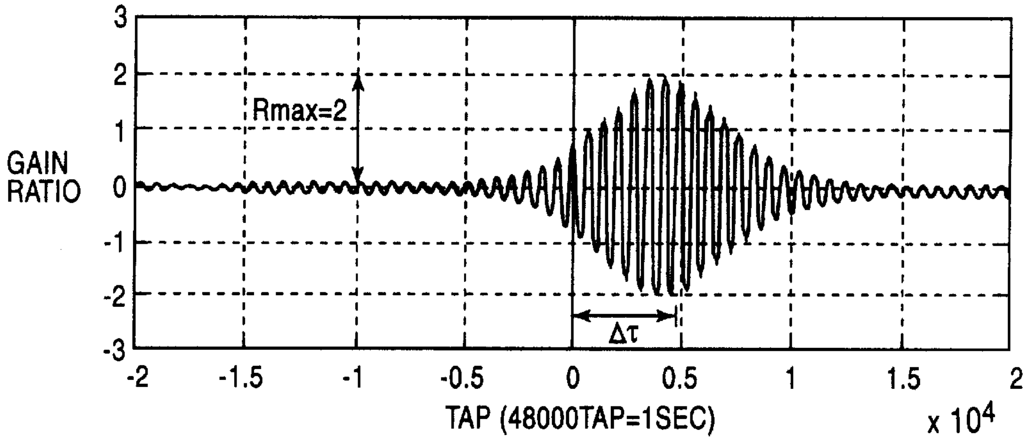
Figure 5C:
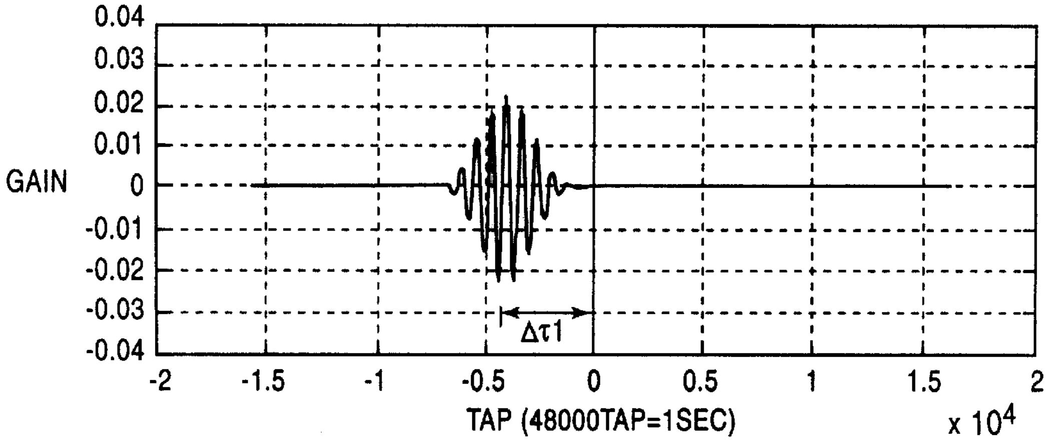

Furthermore, the impulse response train {bn} of the digital filter 21*a* which has the resonance frequency fa as the center frequency has a waveform shown in FIG. 5(*a*), and the cross-correlation function Rab/Rib generated by the correlator 23*a* has a waveform shown in FIG. 5(*b*).

Then, the parameter extracting section 24*a* compared the impulse response train {bn} with the cross-correlation function Rab/Rib to determine the phase difference $\Delta\tau 1$ to be approximately equal to $0.4\times10^4$ taps and the maximum correlation value Rmax which represents the maximum gain ratio to be approximately equal to 2 times.

In addition, FIG. 5(*c*) shows the impulse response train {bn'} of the digital filter 25*a* and the digital compensating filter 11*a*, which are constituted based on the phase difference Δτ1 and the maximum correlation value Rmax.

That is, as seen by comparing FIGS. 5(*a*) to 5(*c*) with one another, the impulse response train {bn'} of the digital compensating filter 11*a* is phase-advanced by a phase of Δτ1 compared with the digital filter 21*a* and has a gain approximately 2 times larger than that of the digital filter 21*a*.

Figure 6A:
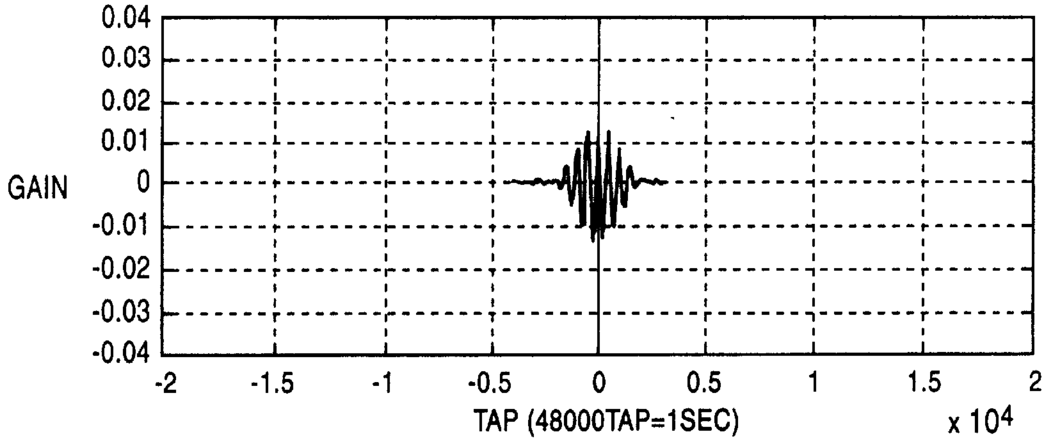
FIGS. 6(*a*), 6(*b*) and 6(*c*) are explanatory views further showing the impulse response trains of digital compensating filters and their formation processes.
Figure 6B:
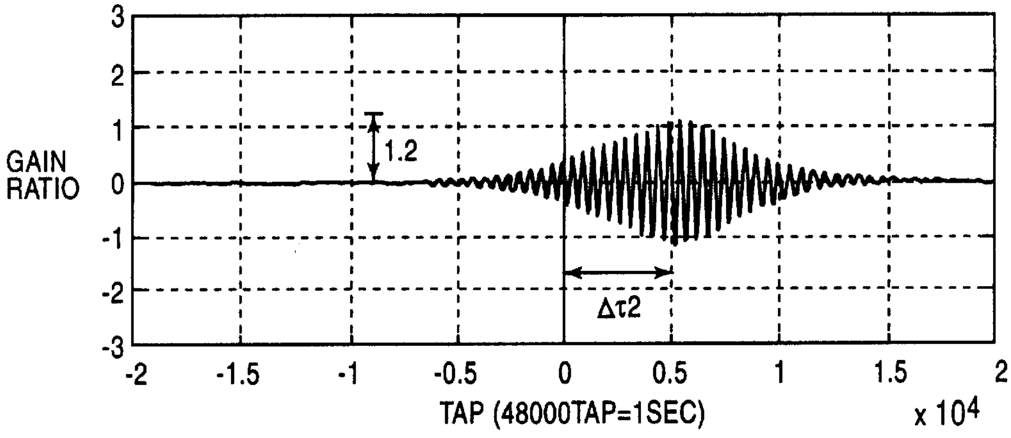
Figure 6C:
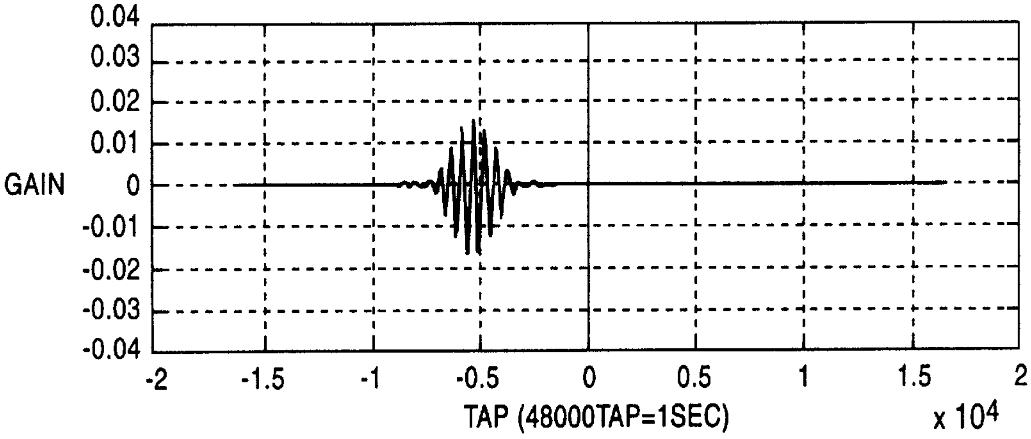

On the other hand, FIG. 6(*a*) shows the impulse response train of the digital filter 28*a* having the resonance frequency fb as the center frequency thereof, FIG. 6(*b*) shows the cross-correlation function generated by the correlator 30*a*, and FIG. 6(*c*) shows the impulse response trains of the digital filter 32*a* and the digital compensating filter 11*b*. Therefore, the impulse response train of the digital compensating filter 11*b* is phase-advanced by a phase of Δτ2 (approximately $0.5\times10^4$ taps) compared with the digital filter 28*a* and has a gain approximately 1.2 times larger than that of the digital filter 28*a*.

Figure 7A:
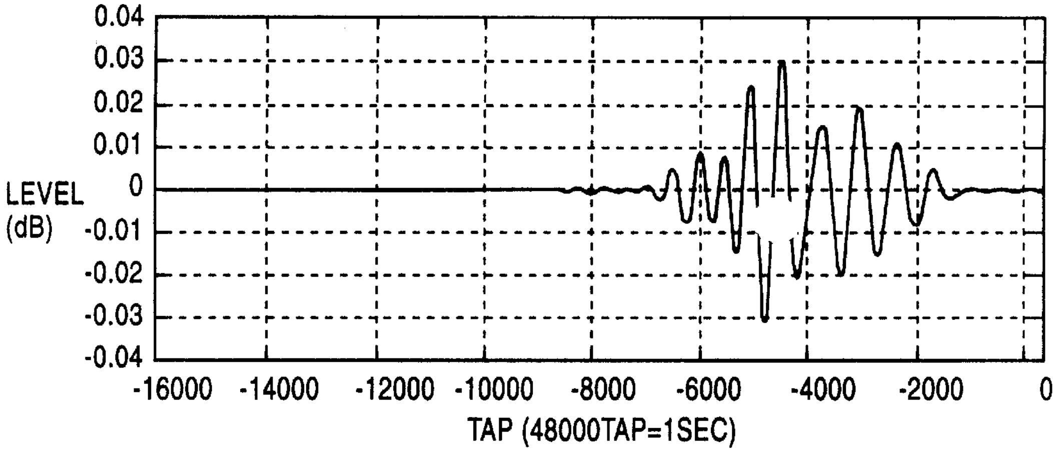
FIGS. 7(*a*), 7(*b*) and 7(*c*) are explanatory views showing the impulse response train of a compensating filter, the frequency characteristics thereof, and the frequency characteristics of the sound produced thereby in a room, respectively.
Figure 7B:
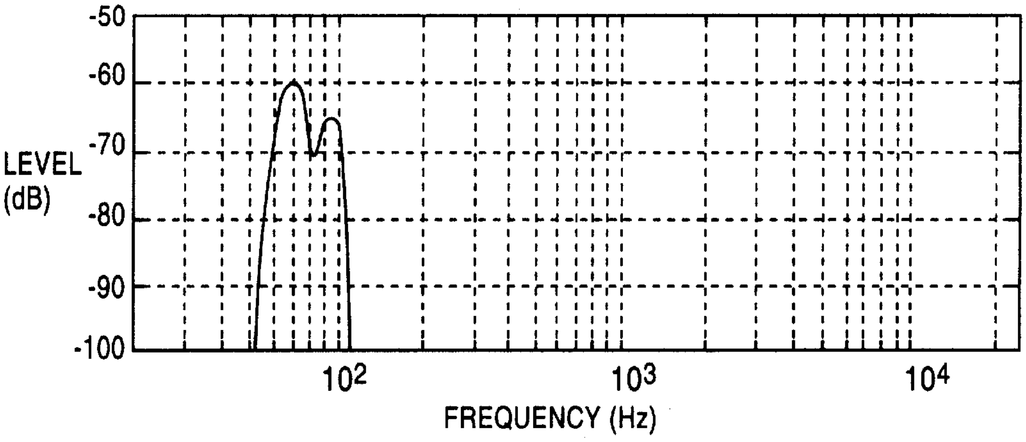
Figure 7C:
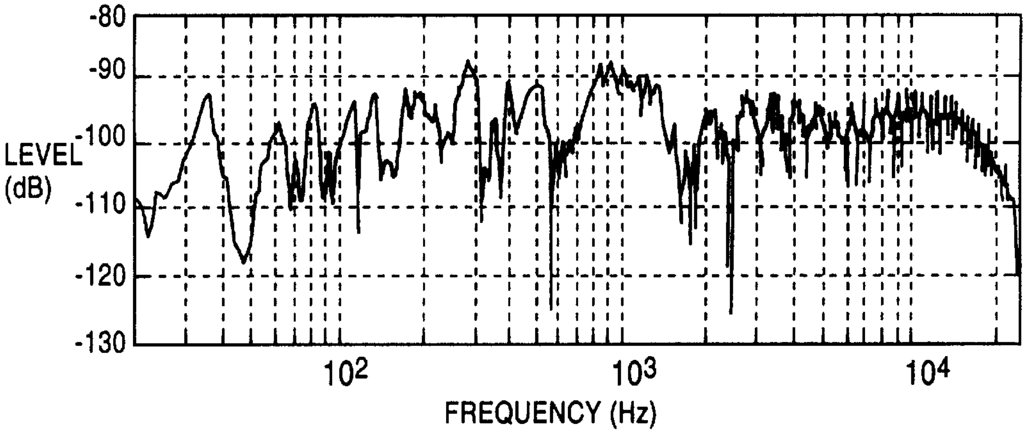

The impulse response train synthesized from the digital compensating filters 11*a* and 11*b*, thus set, that is, the impulse response train of the compensating filter 11 became as shown in FIG. 7(*a*). Moreover, FIG. 7(*b*) shows the frequency characteristics of this impulse response train. Therefore, through the above-mentioned preprocessing, the compensating filter 11 has been constructed as a bandpass filter having peaks at frequencies of approximately 69 Hz and 94 Hz.

Subsequently, by the application of the compensating filter 11 thus constituted, the audio system was actuated in accordance with the aforementioned audio signals $S_R$ and $S_L$. Then, the sound produced in the room 2 by supplying simultaneously the compensation signal Sc and the audio signals $S_R$ and $S_L$ to the compensating loudspeaker 5 and the reproducing loudspeakers 3 and 4, respectively, was measured by means of the microphone MP installed at the listening location. Then, the frequency characteristics of the measured signal $S_{MP}$ were found to be as shown in FIG. 7(*c*).

In the foregoing, compare the frequency characteristics of the sound at the listening location before standing waves have been suppressed as shown in FIG. 3 with those after standing waves have been suppressed as shown in FIG. 7(*c*). Then, it is found that there are peaks at frequencies of approximately 69 Hz and 94 Hz in the frequency characteristics (FIG. 3) of the sound at the listening location before the suppression of the standing wave, and these peaks are frequency components of the standing wave produced in the room 2. On the contrary, the peaks at approximately 69 Hz and 94 Hz have been eliminated in the frequency characteristics (FIG. 7(*c*)) of the sound at the listening location after the suppression of standing waves.

Consequently, according to the audio system of this embodiment, it was proved that the audio system was able to suppress standing waves characterized by the resonance frequency of the transfer function of a room and thus to provide the listener with an improved sound field space as perceived.

It was also proved that one compensating loudspeaker 5 was able to suppress a plurality of standing waves.

Incidentally, this embodiment explained above aims at suppressing standing waves more positively, however, standing waves may preferably produced to the favorite of the listener and thus the sound effects the listener favors may be produced by standing waves.

As an example, the audio system of this embodiment may be provided with an equalizer or the like to vary the frequency characteristics of the digital compensating filters 11*a* to 11*m* and the equalizer or the like may be fine-adjusted by the user, thereby varying the waveform of the compensation signal Sc.

Figure 8A:
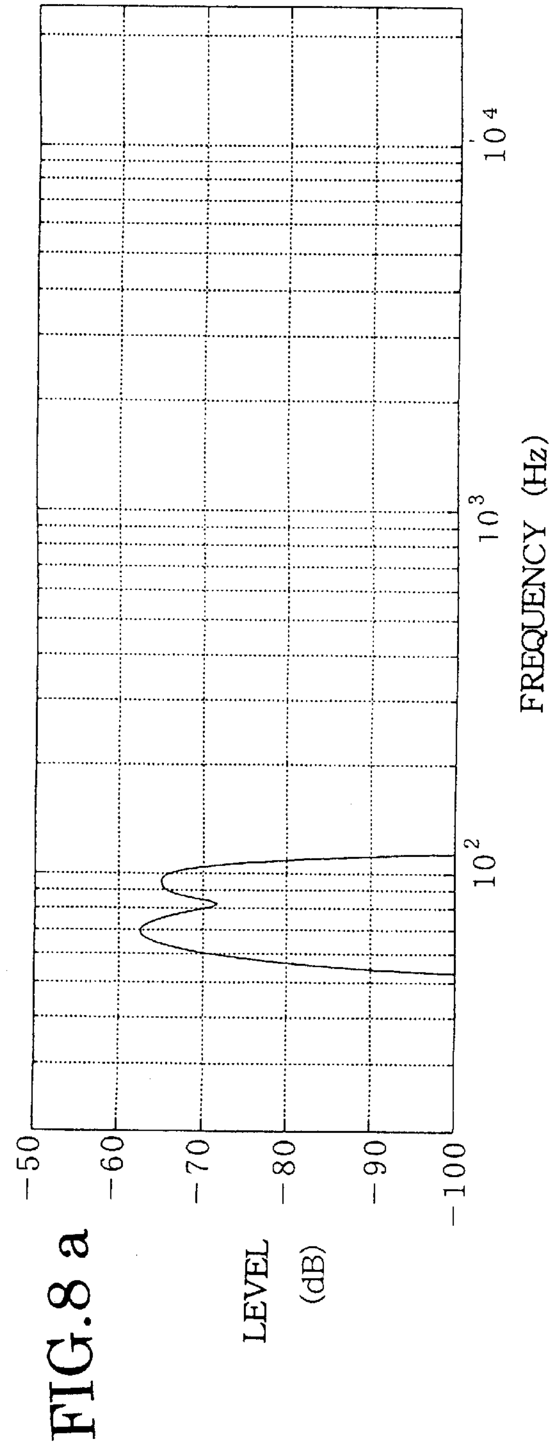
FIGS. 8(*a*) and 8(*b*) are explanatory views showing the frequency characteristics produced in the room when the frequency characteristics of the compensating filter are varied.
Figure 8B:
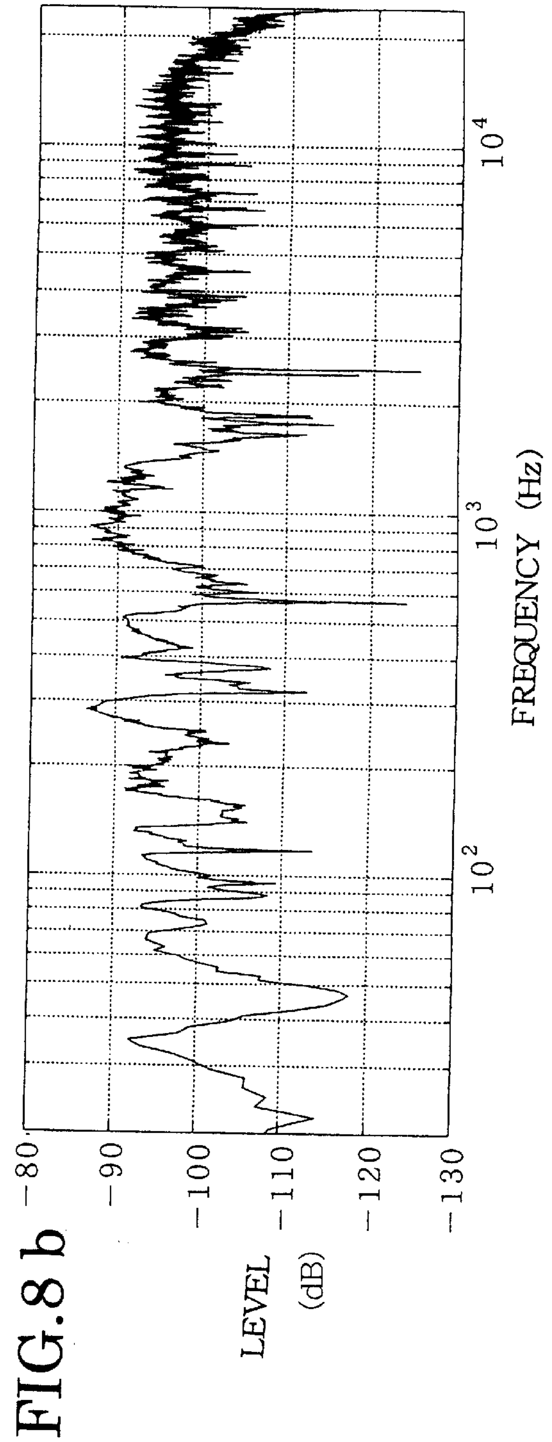

FIGS. 8(*a*) and 9(*c*) show the evaluation results of the system provided with the equalizer. FIG. 8(*a*) shows the case where the equalizer is operated to vary a peak of approximately 69 Hz (approximately −60 dB) of the frequency characteristics of the compensating filter 11 to an extent of approximately −63 dB. FIG. 8(*b*) shows the frequency characteristics of the sound produced at the listening location in the room when the frequency characteristics of the compensating filter 11 are varied in this manner.

Here, it is shown that operating the equalizer decreases the reduction effect of the frequency component at approximately 69 Hz, when comparing FIG. 7(*c*) with FIG. 8(*b*), so that this causes the standing wave of a frequency of approximately 69 Hz to remain.

Figure 9A:
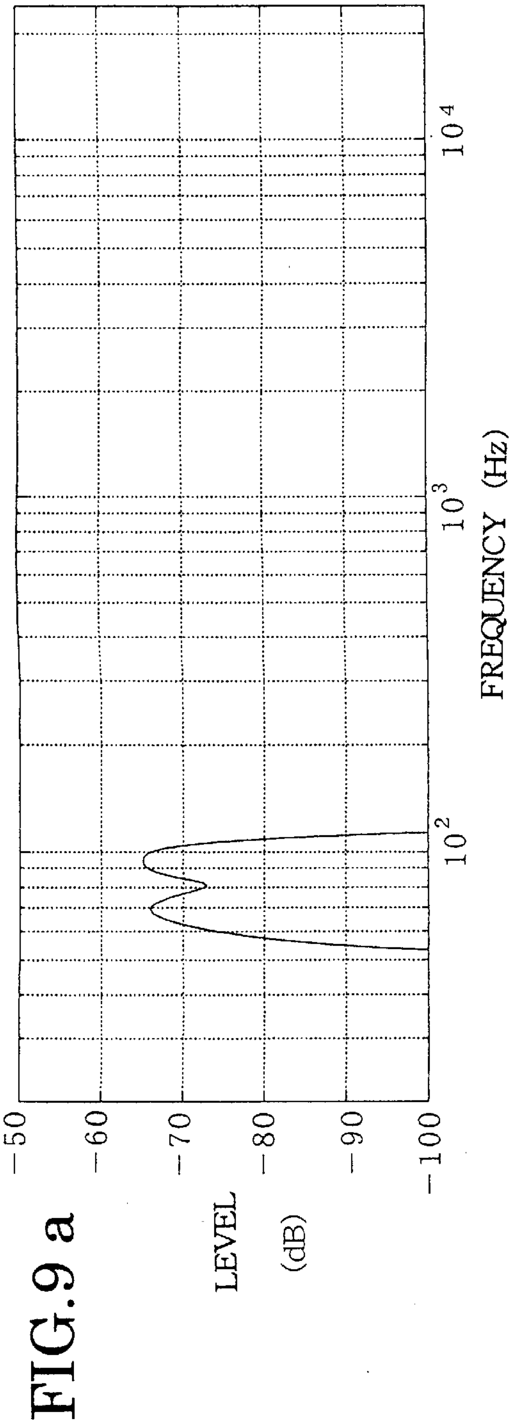
FIGS. 9(*a*) and 9(*b*) are explanatory views further showing the frequency characteristics produced in the room when the frequency characteristics of the compensating filter are further varied.
Figure 9B:
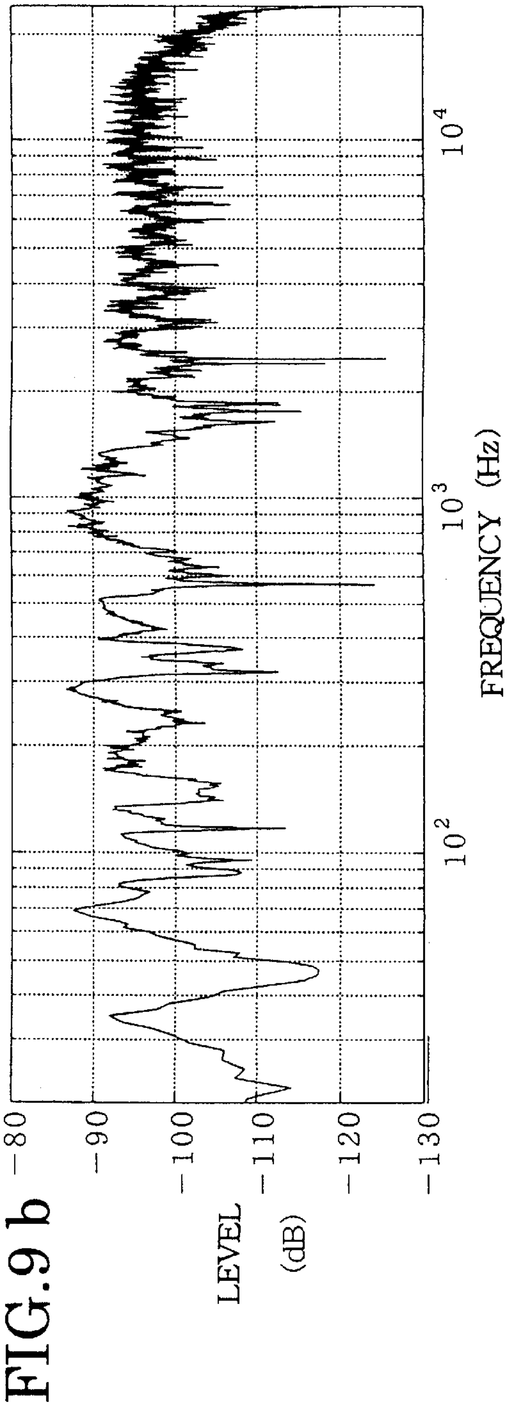

FIG. 9(*a*) shows the case where the equalizer is operated to lower further the peak of approximately 69 Hz of the frequency characteristics of the compensating filter 11 shown in FIG. 7(*b*) to approximately −65 dB. FIG. 9(*b*) shows the frequency characteristics of the sound produced at the listening location in the room when the frequency characteristics of the compensating filter 11 are varied in this manner.

Here, it is shown that setting the peak of the frequency of approximately 69 Hz to −65 dB decreases further the reduction effect of the frequency component at approximately 69 Hz, when comparing FIG. 7(*c*), FIG. 8(*b*), and FIG. 9(*b*) with one another, so that this causes greater standing waves of a frequency of approximately 69 Hz to be produced.

As in the foregoing, making tunable the frequency characteristics of the compensating filter 11 enables adjusting of the produced or remained amount of standing waves readily to the favorite of the listener.

Furthermore, making tunable each of the frequency characteristics of the digital compensating filters 11*a* to 11*m* constituting the compensating filter 11 enables adjusting of the amount of occurrence of standing waves. In addition, data of a plurality of window functions are provided in advance and the convolution operation is applied to these window functions and the impulse response trains of the digital compensating filters 11*a* to 11*m*, respectively, whereby the frequency characteristics of the compensating filter 11 may be varied.

Incidentally, the embodiments explained in the foregoing are provided with digital filters, each constituted by an acyclic filter, however, the present invention is not limited thereto, but includes even the case where a cyclic filter is involved.

Furthermore, though an audio system for stereophonic use has been explained, the present invention is also applicable to audio systems which reproduce sound based on monophonic audio signals.

Furthermore, according to the explanation of this embodiment as shown in FIG. 2, the cross-correlation function between the numeric train {Ari} and the impulse response train {An} is to be determined which are operated at the convolution operational sections 22*a* and 29*a*, respectively. However, the cross-correlation function between the impulse response train {An} and the impulse response train {In} may be determined instead. As mentioned above, even determining the cross-correlation function between the impulse response train {An} and the impulse response train {In} allows this cross-correlation function to provide the similarity between the first and second transfer functions, $H_R$ and $H_L$, and the transfer function $H_I$. Accordingly, setting the impulse response trains or the frequency characteristics of the digital compensating filters 11*a* to 11*m* based on this cross-correlation function enables generating of the compensation signal Sc for suppressing standing waves.

As explained above, according to the present invention, the first sound source reproduces and outputs sound based on an audio signal, and the second sound source reproduces and outputs sound based on a compensation signal for suppressing standing waves, thereby canceling out standing waves. Accordingly, this makes it possible to create a sound field space which is similar to a natural sound field space where only the sound from the first sound source is outputted, and as well provide an improved sound field space for the listener to perceive.

Furthermore, the audio system supplies audio signals of the music or the like, which the listener wants to listen to, directly to the first sound source, while supplying a compensation signal for suppressing standing waves to the second sound source, thereby enabling providing natural sound to the listener. In addition, these sound sources are never over-loaded exceeding each of the operational characteristics, thereby enabling preventing of the occurrence of sound distortion.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. An audio system comprising:

a signal source for outputting audio signals;

a first sound source for receiving said audio signals supplied by said signal source to reproduce and output sound;

compensation means for generating compensation signals for suppressing standing waves by signal-processing said audio signals; and a second sound source for receiving said compensation signals supplied by said compensation means to reproduce and output sound for suppressing standing waves; wherein said compensation means comprises:

correlator means for determining a cross-correlation function between a transfer function from said first sound source to a listening location and a transfer function from said second sound source to said listening location;

filter means having frequency characteristics based on said cross-correlation function generated by said correlator means; and signal inverting means;

said filter means filtering said audio signals, and said signal inverting means inverting signals generated through said filtering, whereby compensation signals to be supplied to the second sound source are generated.

2. An audio system comprising:

a signal source for outputting audio signals;

a first sound source for receiving said audio signals supplied by said signal source to reproduce and output sound;

compensation means for generating compensation signals for suppressing standing waves by signal-processing said audio signals;

a second sound source for receiving said compensation signals supplied by said compensation means to reproduce and output sound for suppressing standing waves;

convolution operational means for performing a convolution operation of a transfer function from said second sound source to a listening location and a transfer function of a predetermined filter means;

a correlator means for determining a cross-correlation function between an operational result of said convolution operational means and a transfer function from said first sound source to said listening location;

extracting means for extracting feature information regarding phases and gain characteristics of said cross-correlation function for said transfer function of said predetermined filter means;

filter means to be set to frequency characteristics characterized by said feature information extracted by said extracting means; and signal inverting means;

said filter means filtering said audio signals, and said signal inverting means inverting signals generated through said filtering, whereby compensation signals to be supplied to said second sound source are generated.

3. The audio system according to claim 1 or 2, wherein said filter means comprises a bandpass filter.

4. The audio system according to claim 1 or 2, wherein said filter means comprises a digital filter.

5. The audio system according to claim 1 or 2, wherein said correlator means comprises a digital correlator.

6. The audio system according to claim 1 or 2, wherein said filter means comprises a combination of a plurality of bandpass filters.

* * * * *